(12) United States Patent
Hamada et al.

(10) Patent No.: US 7,920,644 B2
(45) Date of Patent: Apr. 5, 2011

(54) PREDISTORTION APPARATUS AND PREDISTORTION METHOD (75) Inventors: Hajime Hamada, Kawasaki (JP);
Hiroyoshi Ishikawa, Kawasaki (JP);
Yuichi Utsunomiya, Kawasaki (JP);
Kazuo Nagatani, Kawasaki (JP);
Nobukazu Fudaba, Kawasaki (JP);
Shohei Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/642,003

(22) Filed: Dec. 18, 2009

(65) Prior Publication Data

US 2010/0164620 A1  Jul. 1, 2010

(30) Foreign Application Priority Data

Dec. 26, 2008  (JP) ................. 2008-334963

(51) Int. Cl.
*H04L 25/49* (2006.01)

(52) U.S. Cl. ....................... 375/296; 375/297

(58) Field of Classification Search ........... 375/285, 375/296, 297; 455/114.3, 114.2; 332/107, 332/123, 159, 106, 160, 124, 125
See application file for complete search history.

(56) References Cited

U.S. PATENT DOCUMENTS

| 7,466,762 | B2 * | 12/2008 | Shako et al. ........ 375/296 |
| 7,545,880 | B1 | 6/2009 | Coons et al. |
| 2005/0168283 | A1 * | 8/2005 | Suzuki et al. ........ 330/149 |
| 2005/0180527 | A1 | 8/2005 | Suzuki et al. |
| 2006/0232332 | A1 | 10/2006 | Braithwaite |
| 2008/0298501 | A1 * | 12/2008 | Rabjohn et al. ........ 375/297 |

FOREIGN PATENT DOCUMENTS

| EP | 1 560 329 | 8/2005 |
| JP | 2001-268150 | 9/2001 |
| JP | 2002-335129 | 11/2002 |
| JP | 2006-279780 | 10/2006 |
| JP | 2007-193689 | 8/2007 |

OTHER PUBLICATIONS

V. John Mathews, "Adaptive Polynomial Filters", IEEE Signal Processing Magazine, pp. 10-26, Jul. 1991.
Extended European Search Report for corresponding European Application 09180246.2-2215; dated Apr. 7, 2010.
S. Haykin, "Adaptive filter theory" Kagaku Gijutsu Syuppan pp. 237-238, pp. 442-444, 2001.

\* cited by examiner

*Primary Examiner* — Tesfaldet Bocure (74) *Attorney, Agent, or Firm* — Staas & Halsey LLP (57) ABSTRACT A predistortion apparatus for compensating for a distortion arising from a non linear property in input to output characteristics of an amplifier, by processing calculation of a plurality of coefficients for a plurality of power series defining the predistortion characteristics for a plurality of power ranges, respectively, the predistortion apparatus includes: a coefficient update unit for setting and updating coefficients of the power series to provide the predistortion characteristics for the plurality of power ranges in accordance with a comparison between the input and output of the amplifier; and a determination unit for determining at least one threshold value defining the plurality of power ranges by shifting the threshold value and operating the coefficient update unit for updating the coefficients for each of the power series corresponding to each of the power ranges defined by the shifted threshold value.

6 Claims, 12 Drawing Sheets

PREDISTORTION APPARATUS AND PREDISTORTION METHOD

CROSS-REFERENCE TO RELATED APPLICATION

This application is based upon and claims the benefit of priority of the prior Japanese Patent Application No. 2008-334963, filed on Dec. 26, 2008, the entire contents of which are incorporated herein by reference.

FIELD

A certain aspect of the embodiments discussed herein relates to a technique of a predistortion system for compensating for a distortion arising from a non linear property in input to output characteristics of an amplifier.

BACKGROUND

Generally, a transmission amplifier of high efficiency used in a radio transmission device such as a movable body base station or the like has strong non linear property. Consequently, when a modulation signal for high speed radio communication is transmitted, non linear distortion in such a transmission amplifier causes out-of-band radiation power in a transmission modulation signal and the adjacent transmission channel is affected.

As a system for restraining out-of-band radiation by the transmission amplifier, a predistortion system for compensating non linear distortion in a transmission amplifier by adding a distortion signal having reverse property of the non linear distortion property of the transmission amplifier to an input signal and inputting to the transmission amplifier has been known. In particular, an adaptive pre diction system that adaptively executes distortion compensation by feeding back the output of the transmission amplifier at the input side can drastically restrain out-of-band radiation.

Figure 10:
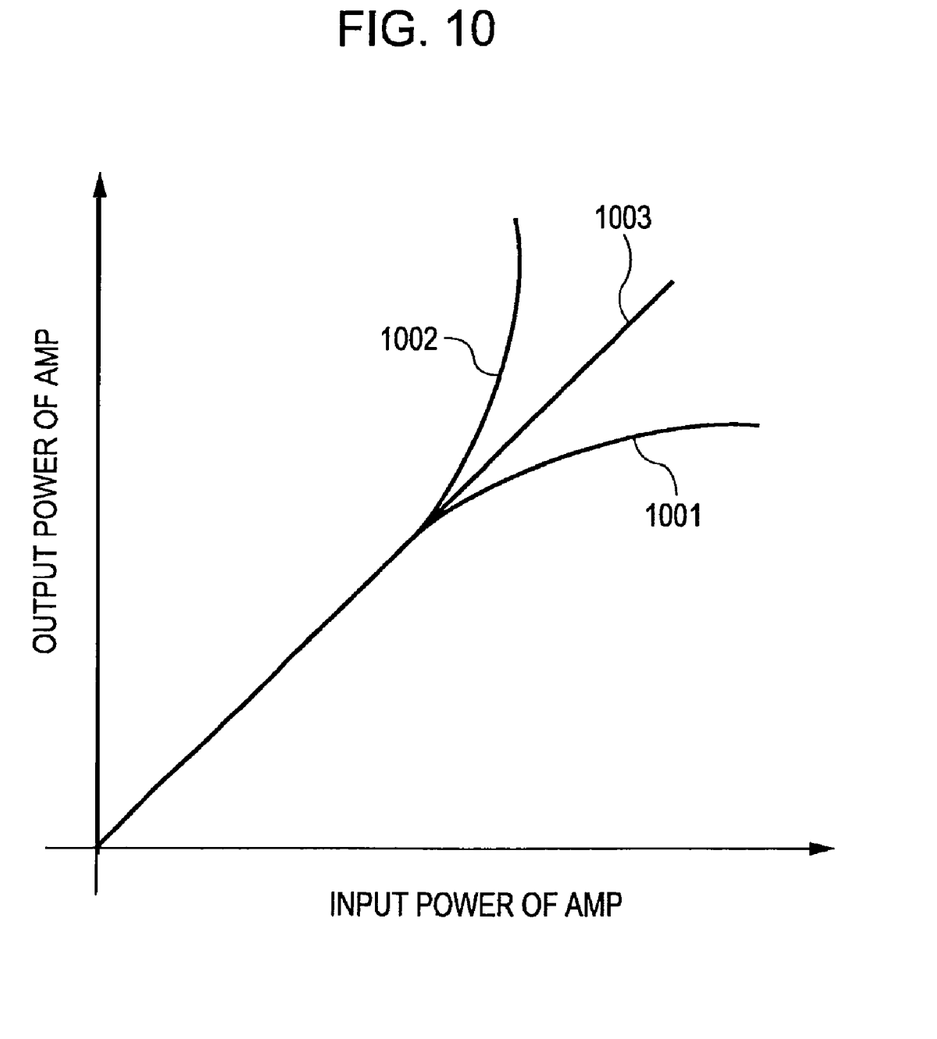
FIG. 10 is a principle diagram of a predistortion system.

FIG. 10 is a principle diagram of the predistortion system. Normally, in the transmission amplifier, output is saturated and a linear signal with respect to an input signal is not output easily as the input power becomes larger (1001 of FIG. 10). The non linear property of the amplifier causes the adverse effect as described below.

Figure 11:
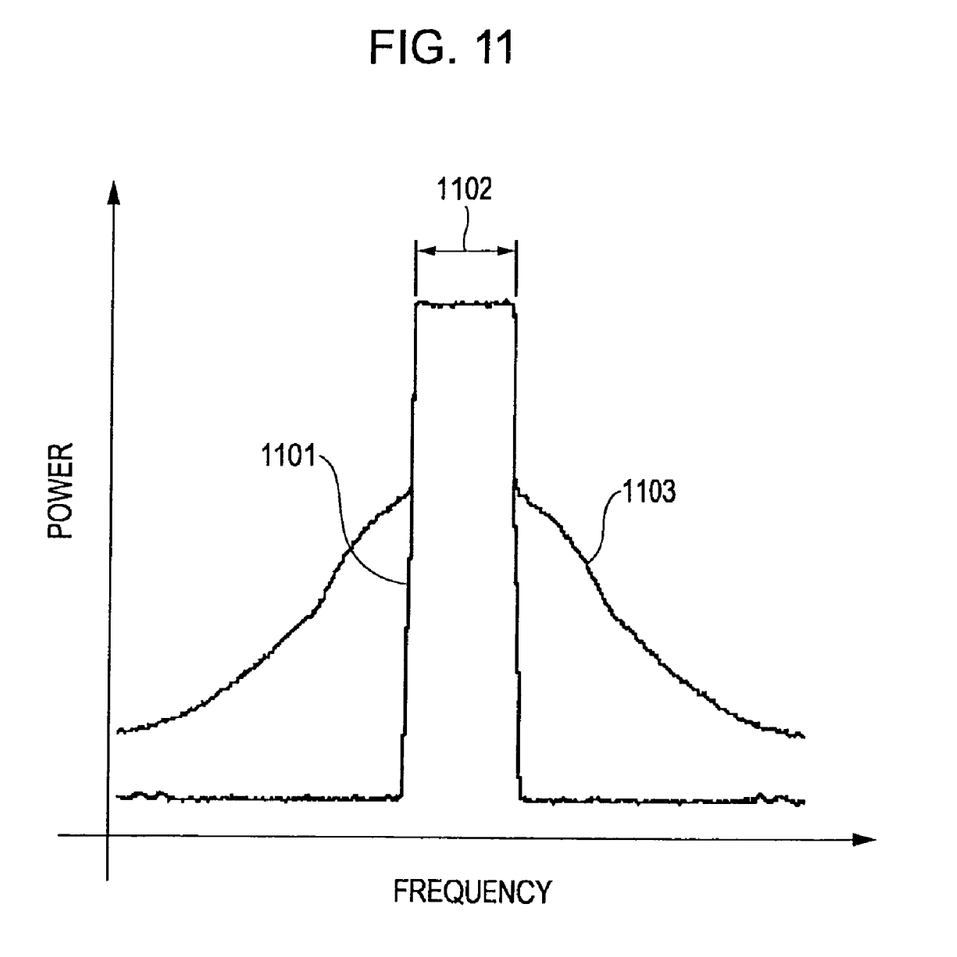
FIG. 11 is an illustration diagram of deterioration of spectrum property caused by non linear property of a transmission amplifier.

FIG. 11 is an illustration diagram of deterioration of spectrum property caused by non linear property of the transmission amplifier.

As illustrated in FIG. 11, the non linear property of the transmission amplifier radiates a needles spectrum 1103 outside a signal band 1102 with respect to an amplifier input 1101. The out-of-band radiation power deteriorates the property of another system using an out-of-band frequency.

Further, a needles spectrum is radiated also in the signal band 1102 although hidden by the signal property in FIG. 11. This causes property deterioration of signal itself.

Further, since many of present digital modulation systems require linear amplifier property, it is not avoided to use a linear low input power part when using an amplifier having the aforementioned saturation property. This causes deterioration of power efficiency of the transmission amplifier.

Consequently, reverse property of the amplifier property is applied to the input signal of the transmission amplifier by suing a predistortion technique (1002 of FIG. 10). By adding non linear amplifier property thereto, in the transmission amplifier output, compensated linear property can be obtained as a result as illustrated in 1003 of FIG. 10.

A predistortion system using power series has been conventionally proposed as a system of the predistortion. This is a system in which a compensation operation in a predistortion unit 1201 at the pre stage of a transmission amplifier is executed by power series calculation to an input signal x as illustrated in FIG. 12.

Figure 12:
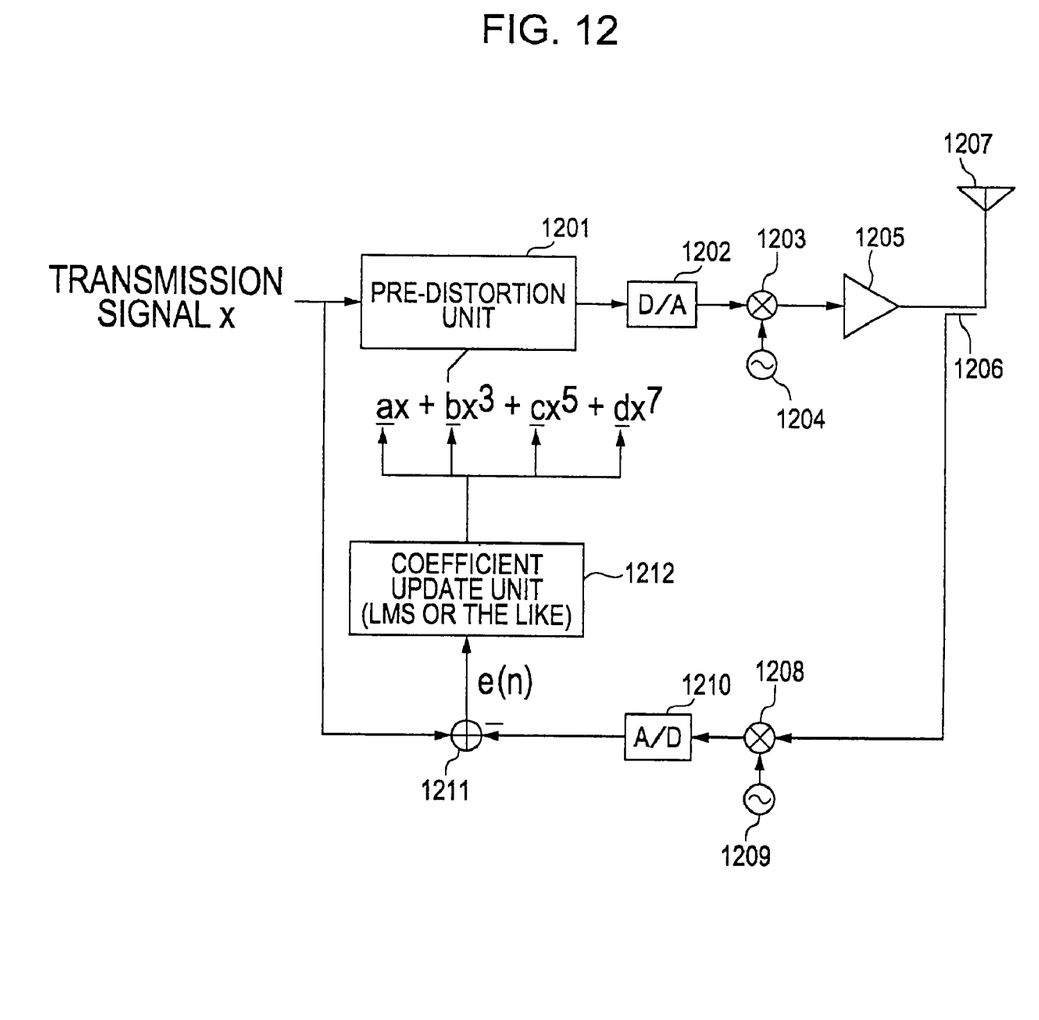
FIG. 12 is a configuration diagram of a conventional distortion compensation device.

That is, in FIG. 12, the predistortion unit 1201 executes a distortion compensation of a transmission amplifier 1205 by executing power series calculation to the input signal x.

The output of the predistortion unit 1201 is converted into an analog signal in a D/A converter 1201, and further is orthogonally modulated by a signal oscillated from a local oscillator 1204 depending on a transmission base station in an orthogonal modulator 1203.

The modulated transmission analog signal is power-amplified in the transmission amplifier 1205, and the output is supplied to a transmission antenna 1207 via a coupler 1206, and is transmitted therefrom. Further, the output of the transmission amplifier 1205 is fed back to the input side from the coupler 1206.

That is, the output of the coupler 1206 is down converted by a signal oscillated from a local oscillator 1209 depending on the transmission base station. Further, the output is returned to a digital signal by an A/D converter 1210 and thereafter returned to a base band by a demodulator not specifically illustrated.

As for a feed back signal $S_{fb}(n)$ obtained by the result, an error signal e(n) between with a transmission signal $S_{ref}(n)$ delayed by a delay circuit not specifically illustrated is calculated in a subtracter 1211.

Then, by a coefficient update unit 1212, power series calculation coefficients a, b, c, d, and the like that are supplied to the predistortion unit 1201 are updated so that the error signal e(n) is minimized based on a calculation of minimum mean squared error (Least Means Square).

In this manner, the power series calculation coefficient is gradually converged to a predetermined value, and a power series calculation is executed to the input signal x in the predistortion unit 1201 by using the power series calculation coefficient converged to the predetermined value. Herewith, in the steady state, non linear property of the analog circuit unit is restrained with a high accuracy while keeping high power efficiency. Then, even when the non linear property is changed due to influence of temperature or frequency, the analog gain variation is detected by the feed back signal $S_{fb}(n)$. Then, the value of the power series calculation coefficient is updated in the direction to compensate the variation in the coefficient update unit 1212, and the change of the property can be dynamically compensated.

Note that the above configuration has a configuration to a complex signal in reality.

In the aforementioned configuration of the conventional technique, for example, assuming that two sine wave signals (two tone signals) whose frequencies are separated by 2Δf are input to an amplifier model that is modeled by a power series.

$$\cos 2\pi(fc-\Delta f)t + \cos 2\pi(fc+\Delta f)t$$

However, fc is carrier frequency. As a result, in the output signal expressed by a power series, only a signal component that is largely separated in frequency from the carrier frequency fc and that is suppressed by a filter of an analog unit or the transmission amplifier itself is included in the term of even-ordered power. On the contrary, in the third power term, a needless component which is fc±3Δf, and in the fifth power term, a needless component which is fc±5Δf is generated at the vicinity of the carrier frequency. Accordingly, the non linear distortion in the transmission amplifier 1205 can be modeled by a power series constituted by only an odd-ordered power term. Consequently, as illustrated in FIG. 12, it is general that the power series calculated by the predistortion unit 1201 is constituted by only an odd-ordered power term.

Hereafter, as a formula of a power series, a simple power series formula which is $ax+bx^3+cx^5+dx^7$ will be described for simplification. In the distortion compensation in reality, it is general to use a more complicated type power in which Volterra power and a delay component are considered in order to modeling the property of the transmission amplifier 1205 more surly. The detail thereof is described in the following Non-Patent Document 1.

[Patent Document 1] Japanese Laid-Open Patent Application Publication No. 2001-268150

[Patent Document 2] Japanese Laid-Open Patent Application Publication No. 2002-335129

[Non-Patent Document 1] V. J. Mathews and G. L. Sicuranza: "Polynomial Signal Processing", John Wiley & Sons, Inc. (2000)

[Non-Patent Document 2] S. Haykin: "Adaptive filter theory" Kagaku Gijutsu Syuppan (2001). (translated by Hiroshi Suzuki, et al)

[Non-Patent Document 3] V. Mathews: "Adaptive polynomial filters", IEEE Signal Processing Magazine, pp. 10-26(1991).

SUMMARY

According to an aspect of an embodiment, a predistortion apparatus for compensating for a distortion arising from a non linear property in input to output characteristics of an amplifier, by processing calculation of a plurality of coefficients for a plurality of power series defining the predistortion characteristics for a plurality of power ranges, respectively, so as to apply a reverse property corresponding to the non linear property in the amplifier to input of the amplifier, the predistortion apparatus includes: a coefficient update unit for setting and updating coefficients of the power series to provide the predistortion characteristics for the plurality of power ranges in accordance with a comparison between the input and output of the amplifier; and a determination unit for determining at least one threshold value defining the plurality of power ranges by shifting the threshold value and operating the coefficient update unit for updating the coefficients for each of the power series corresponding to each of the power ranges defined by the shifted threshold value so as to optimize the predistortion characteristics for each of the power ranges.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, an embodiment of a distortion compensation device to be disclosed will be described in detail with reference to drawings. Note that functions of a predistortion unit and the like of the disclosed distortion compensation device are provided, for example, by mounting a DSP (Digital Signal Processor).

As a system for improving distortion compensation capability of a conventional power series type predistortion system illustrated in FIG. 12, there is a predistortion system using plurality of power series.

Since the disclosed embodiment assumes a predistortion system using a plurality of power series, first, the basic configuration will be described.

Figure 1:
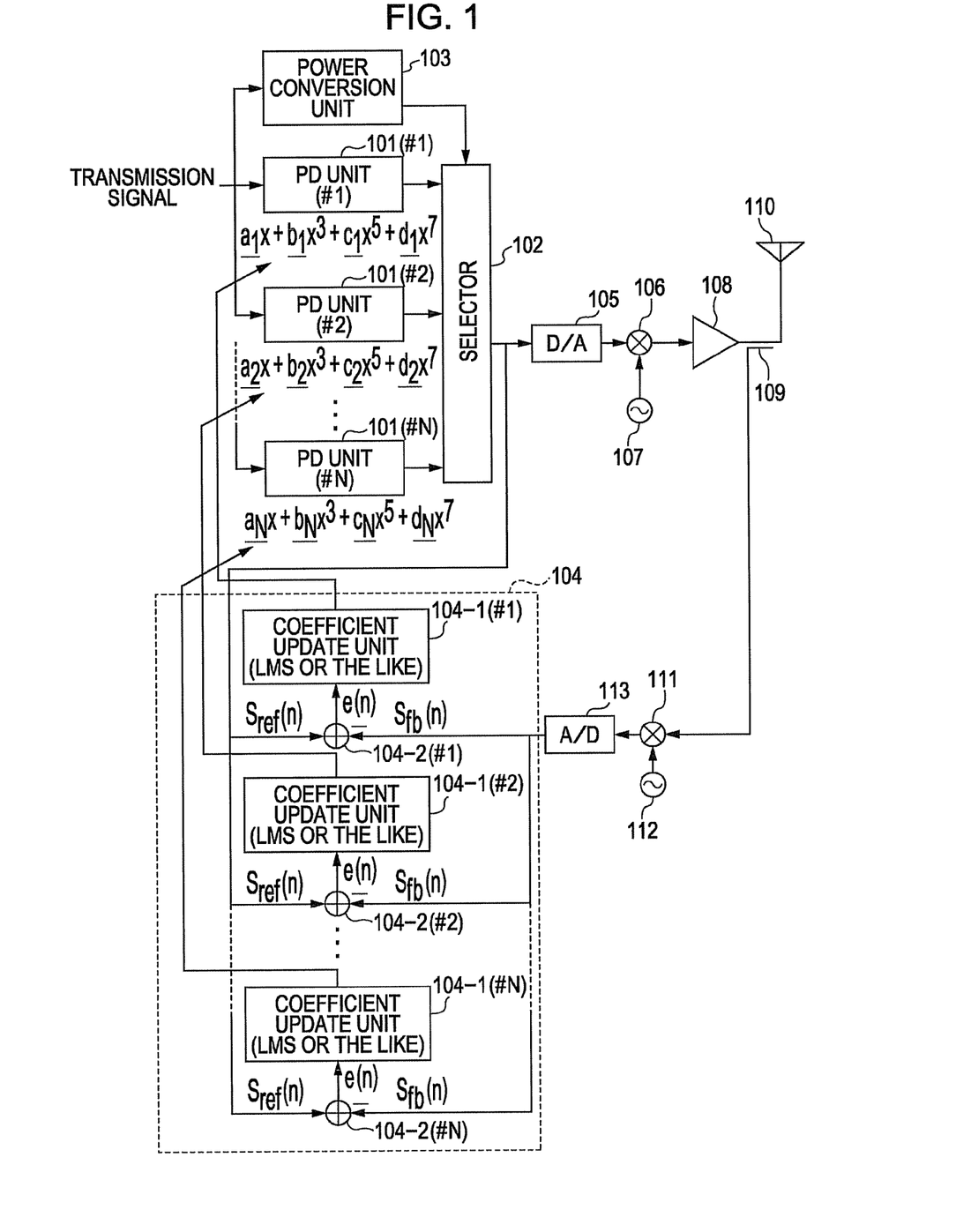
FIG. 1 is a configuration diagram of a plurality of power series predistortion system distortion compensation device.

FIG. 1 is a configuration diagram of a plurality of power series predistortion system distortion compensation device.

A plurality numbers of predistortion units (PD units) 101 #1 to #N constituted by a power series calculation are prepared, and each PD unit executes a different power series calculation based on a power series calculation group which is respectively different.

Figure 2:
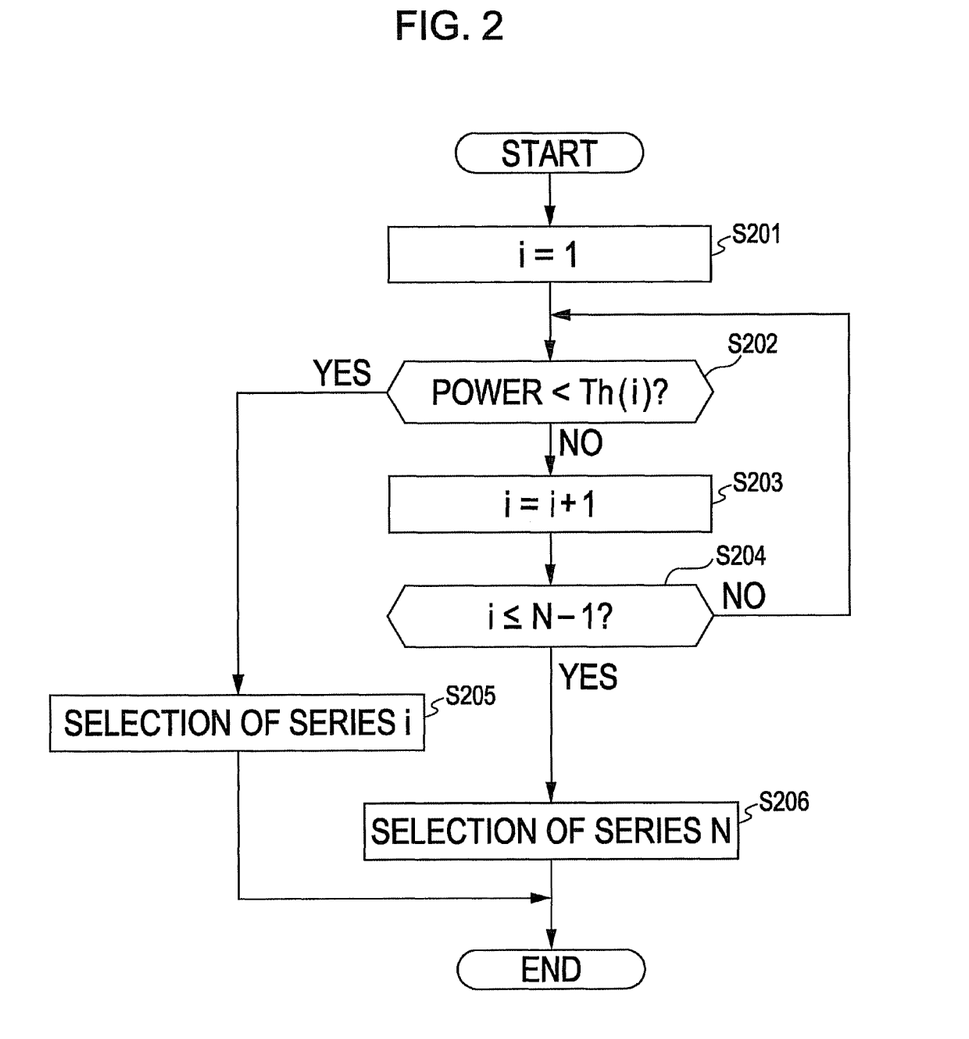
FIG. 2 is an operation flowchart illustrating a selection operation of power series by a selector.

A selector 102 holds N-1 number of power threshold values, and is operated in accordance with an operation flowchart illustrated in FIG. 2. The selector 102 executes the following operation for the minimum threshold value Th(1) (step S201), in series (step S203), and the maximum threshold value Th(N-1) (step S204). That is, the selector 102 compares large and small of a power signal value obtained by converting a power of a transmission signal in a power conversion unit 103 and a threshold value Th(i) ($1 \leq i \leq N-1$) (step S202). Then, the selector 102 selects the PD unit 101 of #i at the time when judged that the power signal value is smaller than the threshold value Th(i). Note that, when the selector 102 judges that the power signal value is not less than the threshold value Th(N-1), the selector 102 selects the PD unit 101 of #N (steps S204→S206). Then, the selector 102 supplies the output of the selected PD unit 101 in a D/A converter 105.

The D/A converter 105 converts the output from one PD unit 101 to an analog signal.

The converted result is orthogonally modulated by a signal oscillated from a local oscillator 107 in accordance with a transmission base station.

The modulated transmission analog signal is power-amplified in a transmission amplifier 108, and the output is supplied to a transmission antenna 110 via a coupler 109, and is transmitted therefrom.

Further, the output of the transmission amplifier 108 is fed back from the coupler 109 to the input side.

That is, the output of the coupler 109 is down converted by a signal oscillated from a local oscillator 112 in accordance with the transmission base station in a down converter 111. The output obtained by the result is returned to a digital signal by an A/D converter 113, and thereafter is returned to a base band by a demodulator not specifically illustrated.

A feed back signal $S_{fb}(n)$ obtained thereby is input to a coefficient update block 104.

In the coefficient update block 104, operations described below are executed in order to adaptively associate each distortion compensation property of the PD units 101 of #1 to #N with the variation of amplifier property caused by variation of amplifier property due to individual difference of the transmission amplifier 108, change of amplifier property caused by age change, temperature change, or the like.

First, in subtracters 104-2 of #1 to #N, each error signal $e(n)$ between the feed back signal $S_{fb}(n)$ and a transmission signal $S_{ref}(n)$ obtained by delaying the output of the selector 102 by a delay circuit not specifically illustrated is calculated.

Then, in coefficient update units 104-1 of #1 to #N, power series calculation coefficients $a_i$, $b_i$, $c_i$, $d_i$, and the like ($1 \leq i \leq N$) that are supplied to the PD units 101 of #1 to #N are updated so that each error signal $e(n)$ satisfies predetermined conditions by which the coefficient becomes the optimum based on a calculation of minimum mean squared error (Least Means Square) (in the embodiment, so that each error signal $e(n)$ is minimized).

In this manner, each power series calculation coefficient group in each PD unit 101 of #1 to #N is gradually converged to a predetermined value, and a power series calculation is executed to an input signal x by each PD unit 101 by using each power series calculation coefficient group converged to the predetermined value.

It is general to use an adaptation algorithm that requires small calculation and that easily follows time variation for the update of each power series calculation coefficient group. Since a plurality of groups of power series calculation coefficient group are used in the embodiment, it is effective to appropriately move the adaptation algorithm for each of the groups to converge the coefficient group.

As the adaptation algorithm of the power series calculation coefficient group besides the aforementioned LMS, there generally includes an algorithm such as RLS (see aforementioned Non-Patent Document 2). Then, in the algorithms, a constant so called as a convergence coefficient for adjusting the seed of the convergence and the stability after the convergence by the relation of trade off is important. For example, in the case of an LMS algorithm, the update formula of the coefficient $h(n)$ is expressed by the following formula by using the feed back signal $Sfb(n)$ and error signal $e(n)$ (see aforementioned Non-Patent Document 3), and $\mu$ among the formula becomes a convergence coefficient $$h(n+1)=h(n)+\mu e(n)s_{fb}(n)$$

Since coefficient $h(n+1)$ at the next point is calculated by multiplying $\mu$ by the magnitude of the coefficient update component which is "$e(n)S_{fb}(n)$" and thereafter adding the coefficient $h(n)$ at the moment, as $\mu$ becomes larger, the convergence becomes earlier. On the other hand, once converged, it is not necessary to largely change $h(n)$, and stability after convergence is increased as $\mu$ becomes smaller.

As described above, in the steady state, the non linear distortion property of the analog circuit unit is restrained with high accuracy while keeping high power efficiency. Then, even when the non linear distortion property is changed by the influence of temperature or frequency, the analog gain variation is detected by the feed back signal $S_{fb}(n)$, and each power series calculation coefficient group is updated in the direction to compensate the variation in the coefficient update block 104. As a result, the variation of the property can be dynamically compensated.

Figure 3:
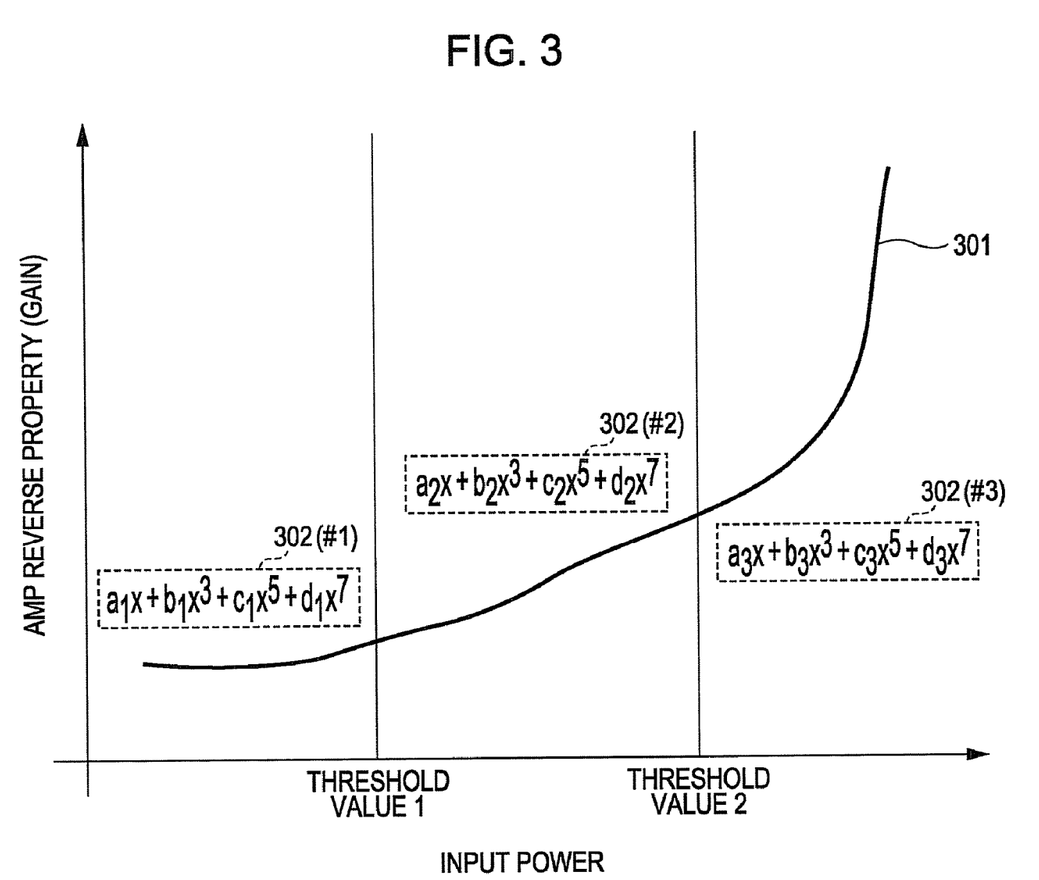
FIG. 3 is a conceptual diagram of distortion compensation using a plurality of power series (diagram illustrating an example of input power against amplifier reverse property (gain property)).

FIG. 3 is a conceptual diagram of distortion compensation using a plurality of power series, and is a diagram illustrating an example of input power against amplifier reverse property (gain property).

An amplifier reverse property 301 that is simulated by using power series has a complicated curved line in an actual transmission amplifier, and the error is increased when this is expressed by one power series. Herein, in the configuration of the distortion compensation device of FIG. 1, threshold values such as threshold value 1, threshold value 2 are provided in the (converted) power value of the transmission signal as illustrated in FIG. 3. Then, a distortion compensation calculation is executed by different power series groups 302 such as #1 to #3 for every input power interval delimited by the threshold values.

Herewith, in the distortion compensation calculation, the property which is closer to the actual amplifier reverse property 301 can be modeled as compared with the case when a power series is singly used, and distortion compensation property can be improved.

Herein, the power threshold vale for selecting a plurality of power series used by the selector 102 affects a large influence on the quality of the output signal. The determination method of the power threshold value will be concretely disclosed in the following description of an embodiment.

In the embodiment described below, a circuit for converging the coefficient of the power series which are used for distortion compensation is prepared by another system, and the power threshold values of the plurality of power series are determined by using the another system. Herewith, the optimum threshold values can be freely set also during operation in which property deterioration of amplifier output is not permitted, and adjustment move can be decreased in a factory, and optimum setting of the threshold values under the operation environment becomes possible.

Figure 4:
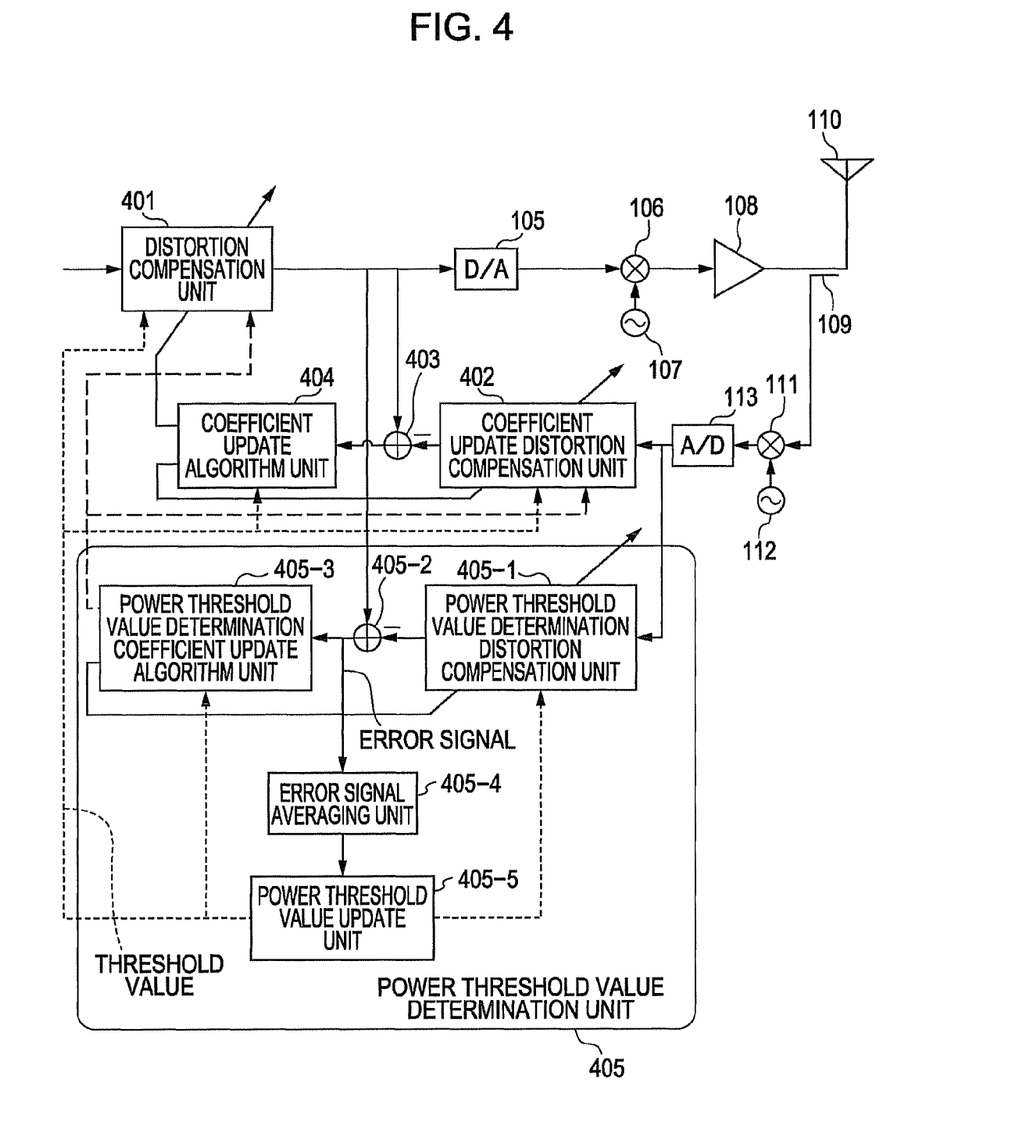
FIG. 4 is a configuration diagram of an embodiment of a distortion compensation device.

FIG. 4 is a configuration diagram of an embodiment of a distortion compensation device having the same base structure as that of FIG. 1.

In FIG. 4, the same reference numeral is used to denote the same configuration part as that in the case of FIG. 1.

In FIG. 4, a distortion compensation unit 401 corresponds to the PD units 101 of #1 to #N, the selector 102, and the power conversion unit 103 of FIG. 1. Further, a subtracter 403 correspond to the subtracters 104-2 of #1 to #N of FIG. 1, and a coefficient update distortion compensation unit 402 and a coefficient update algorithm unit 401 correspond to the coefficient update units 104-1 of #1 to #N of FIG. 1. The configuration of a coefficient update distortion compensation unit 402 is the same as the configuration of the distortion compensation unit 401.

An error signal between a predistortion signal output from the distortion compensation unit 401 and a signal output from the transmission amp 108 via the coupler 109 to be fed back and passed through the coefficient update distortion compensation unit 402 are obtained by the subtracter 403. Then, the coefficient update algorithm unit 404 obtains an updated plurality of power series calculation coefficient group by executing a coefficient update algorithm such as LMS, RLS, or the like to the error signal. Update of the coefficient is finished by setting the updated plurality of power series calculation coefficient group in the distortion compensation unit 401 and the coefficient update distortion compensation unit 402.

In the embodiment, besides the normal coefficient update block, a power threshold value determination unit 405 is provided. The coefficient update unit of the another system is similar to the normal coefficient update unit as a basic operation. That is, a power threshold value determination distortion compensation unit 405-1 has the same configuration as the distortion compensation unit 401. However, the power threshold value determination unit 405 does not update the power series calculation coefficient group of the distortion compensation unit 401 and the coefficient update compensation distortion unit 402 that execute a predistortion with respect to the actual transmission signal. Instead, the power threshold determination unit 405 determines the optimum power threshold value by observing the error signal obtained by a subtracter 405-2 via an error signal averaging unit 405 while changing the power threshold value in a power threshold value determination unit 405-5. Since the plurality of power series calculation coefficient group of the distortion compensation unit 401 and the coefficient update distortion compensation unit 402 is not updated, the determination operation of the power threshold value can be executed without affecting an influence on the output of the transmission amplifier 108.

Figure 5:
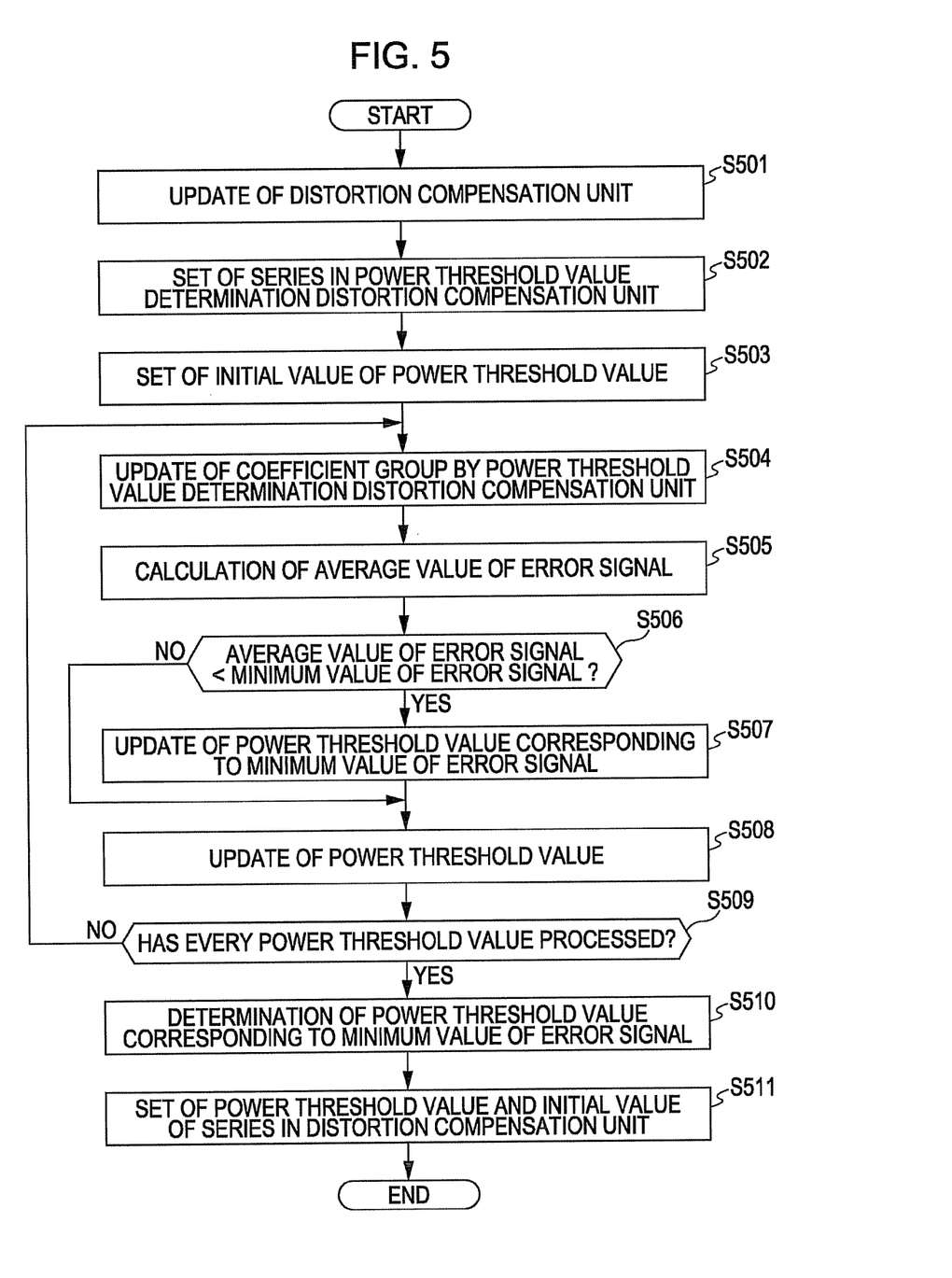
FIG. 5 is an operation flowchart of a threshold value determination algorithm.

FIG. 5 is an operation flowchart illustrating a control operation of the power threshold value determination coefficient update algorithm unit 405-3, the error signal averaging unit 405-4, and the power threshold value update unit 405-5 in the power threshold value determination unit 405.

The power threshold value of the plurality of power series is not determined in the initial step. Consequently, first, in the operation starting time of the distortion compensation device, a normal update processing of the power series calculation coefficient group in the coefficient update algorithm unit 404 in one series state is executed till the series is converged (step S501).

The power series calculation coefficient group calculated in this manner is set in the power threshold value determination distortion compensation unit 405-1 as an initial value (step S502).

In the state, first, the initial power threshold value is initially set to be a two series state (step S503). Then, the power threshold value update unit 405-5 executes a series of processing of the following step S504 to S507 till it is judged that every power threshold value is processed (step S509) while updating the power threshold value in a predetermined range (step S508).

That is, first, the power threshold value update unit 405-5 sets the present power threshold value in the selector 102 (see FIG. 1) in the power threshold value determination distortion compensation unit 405-1 and executes the predistortion processing (see FIG. 2). Then, the power threshold value determination coefficient update algorithm unit 405-3 updates the power series calculation coefficient group in the power threshold value determination distortion compensation unit 405-1 (step S504).

At the point when the aforementioned power series calculation coefficient group is sufficiently converged, the error signal averaging unit 405-4 calculates the average value of the error signal output from the subtracter 405-2 (step S505).

Subsequently, the power threshold value update unit 405-5 judges whether or not the average value of the error signal presently obtained as described above is smaller than the minimum value of the error signal internally held at the moment (step S506).

When the average value of the present error signal is smaller than the minimum value of the error signal, the power threshold value update unit 405-5 replaces the minimum value of the error signal with the average value of the present error signal, and newly internally stores the present power threshold value (step S507). Note that, the initial value of the minimum value of the error signal shall be a sufficiently large value, and the average value of the initial error signal is selected as the minimum value, and the power threshold value at the moment is stored.

At the time when the processing of the aforementioned steps S504 to S507 is finished to every power threshold value, the power threshold value update unit 405-5 determines the power threshold value corresponding to the minimum value of the error signal internally stored as the power threshold value to be newly employed (step S510).

As described above, the optimum power threshold value is determined by comparing the average values of the error signal while changing the power threshold value.

The power threshold value update unit 405-5 can operate the actual predistortion processing (see FIG. 2) at the optimum power threshold value by setting the optimum power threshold value determined in this manner in the selector 102 (see FIG. 1) in the distortion compensation unit 401. Further, the power threshold value update unit 405-5 can shorten the coefficient convergence time in each distortion compensation unit by simultaneously setting also the power series calculation coefficient group converged by the optimum power threshold value in the distortion compensation unit 401 and the coefficient update distortion compensation unit 402.

Figure 6:
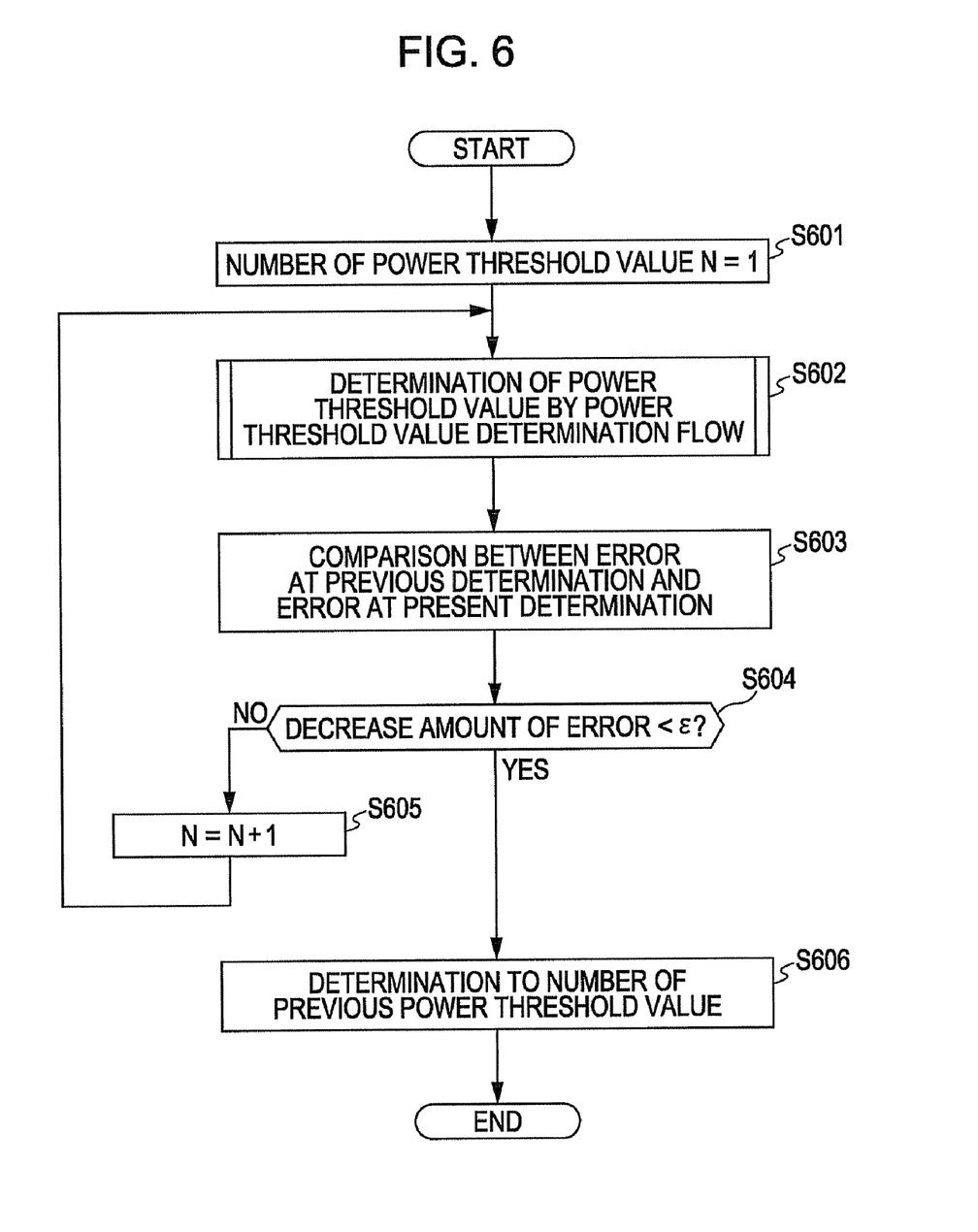
FIG. 6 is an operation flowchart of a threshold value increase algorithm.

Next, FIG. 6 is an operation flowchart illustrating a control operation that is executed by the power threshold value determination unit 405 in order to increase the number of the series (that is, the number N of the power threshold value in FIG. 2).

The power threshold value determination unit 405, first, executes the following series processing while sequentially increasing the value of the number N of the power threshold value (step S605) from one (step S601).

First, the power threshold value determination unit 405 executes the operation flowchart of FIG. 5 to determine N number of the optimum power threshold values for the number N of power threshold values presently set (step S602).

Then, the power threshold value determination unit 405 compares the minimum value of the error signal obtained when the optimum power threshold value is determined at the previous time (see step S510 of FIG. 5) and the minimum value of the error signal obtained when the optimum power threshold value is determined at the present time (see step S603).

As a result, the power threshold value determination unit 405 judges whether or not the decreased amount of the error becomes smaller than a predetermined constant ϵ (step S604).

When the decreased amount of the error is not smaller than the predetermined constant ϵ, the power threshold value determination unit 405 adds 1 to number N of the power threshold value (step S605), and executes the processing of step S602 again.

At the point when the decreased amount of the error becomes smaller than the predetermined constant ϵ, the power threshold value determination unit 405 regards that the previous power threshold value of number N-1 is sufficient and determines the number of the power threshold value (step S606). Herewith, the optimum power threshold value is determined by using the appropriate number N of the power threshold value.

Figure 7:
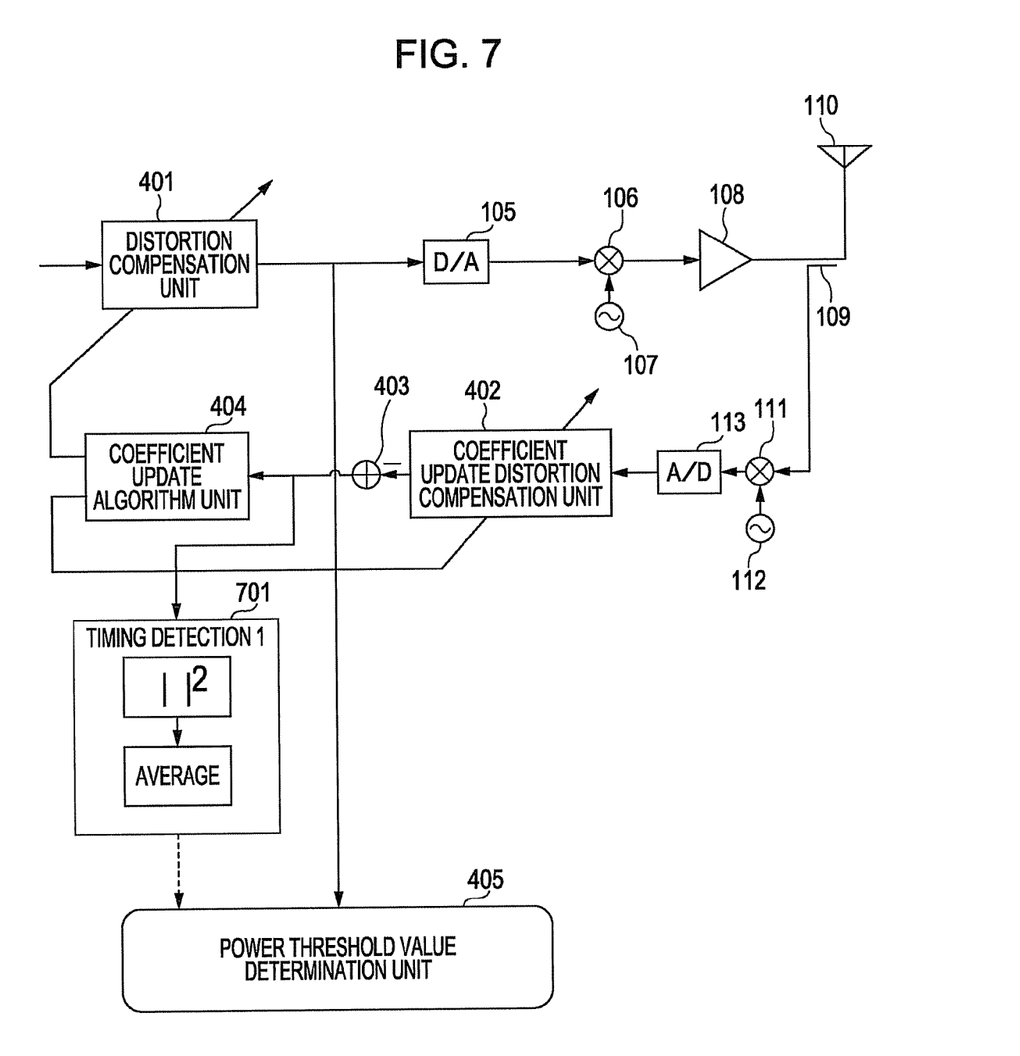
FIG. 7 is a diagram illustrating a configuration example for detecting an operation timing of a power threshold value determination unit 405.

FIG. 7 is a diagram illustrating a configuration example for detecting an operation timing of the power threshold value determination unit 405 of FIG. 4.

In FIG. 7, a timing detection unit 1 701 averages the power value of the error signal output from the subtracter 403, and activates the power threshold value determination processing (FIG. 5) in the power threshold value determination unit 405 at the point when the average value exceeds the threshold value.

Figure 8:
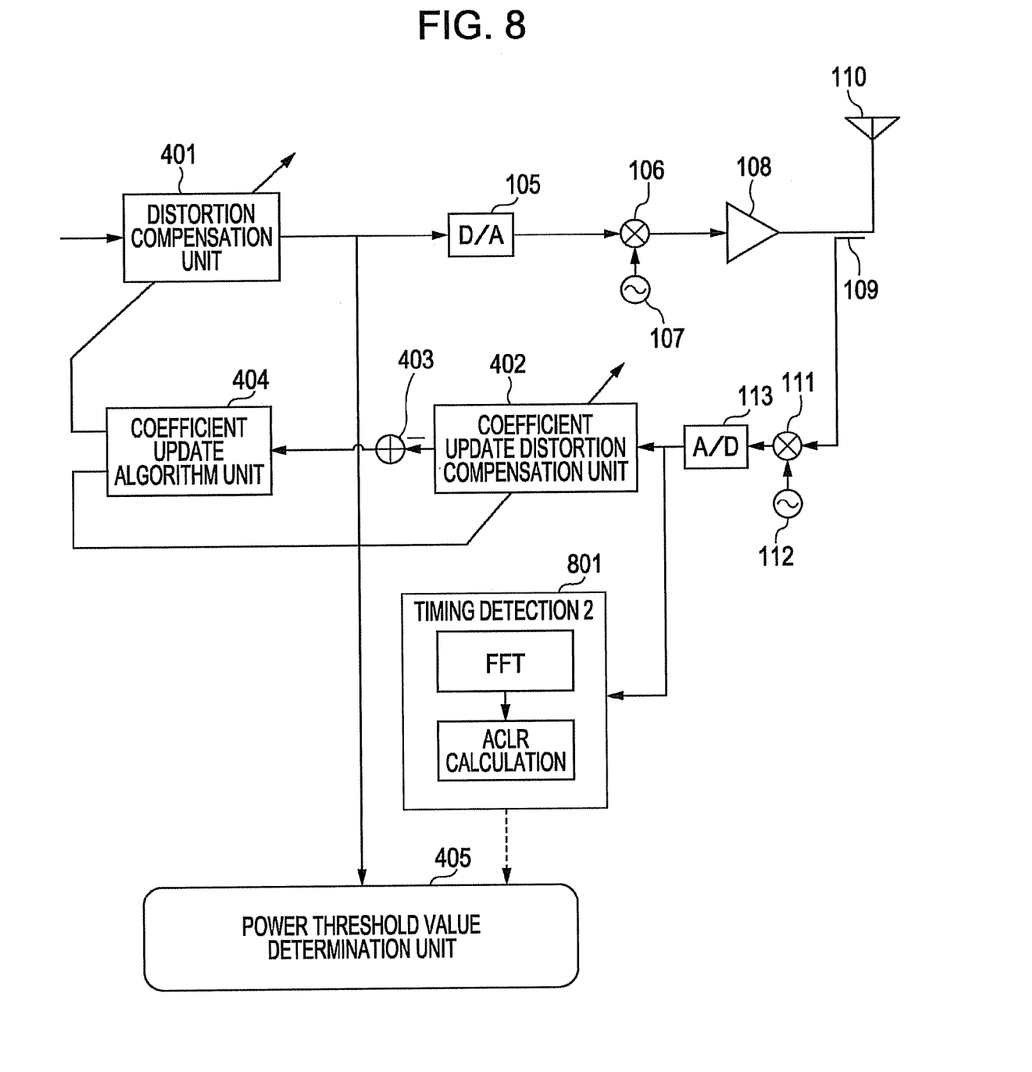
FIG. 8 is a diagram illustrating another configuration example for detecting an operation timing of the power threshold value determination unit 405.

FIG. 8 is a diagram illustrating another configuration example for detecting an operation timing of the power threshold value determination unit 405 of FIG. 4.

In FIG. 8, first, a timing detection unit 2 801 executes fast Fourier Transform (FFT) on the feed back signal output for the A/D converter 113 to obtain a frequency spectrum.

Then, the timing detection unit 2 801 calculates ACLR (Adjacent Channel Leakage Ratio) from the calculated frequency spectrum, and activates the power threshold value determination processing (FIG. 5) in the power threshold value determination unit 405 at the point when the value exceeds a predetermined threshold value.

Figure 9:
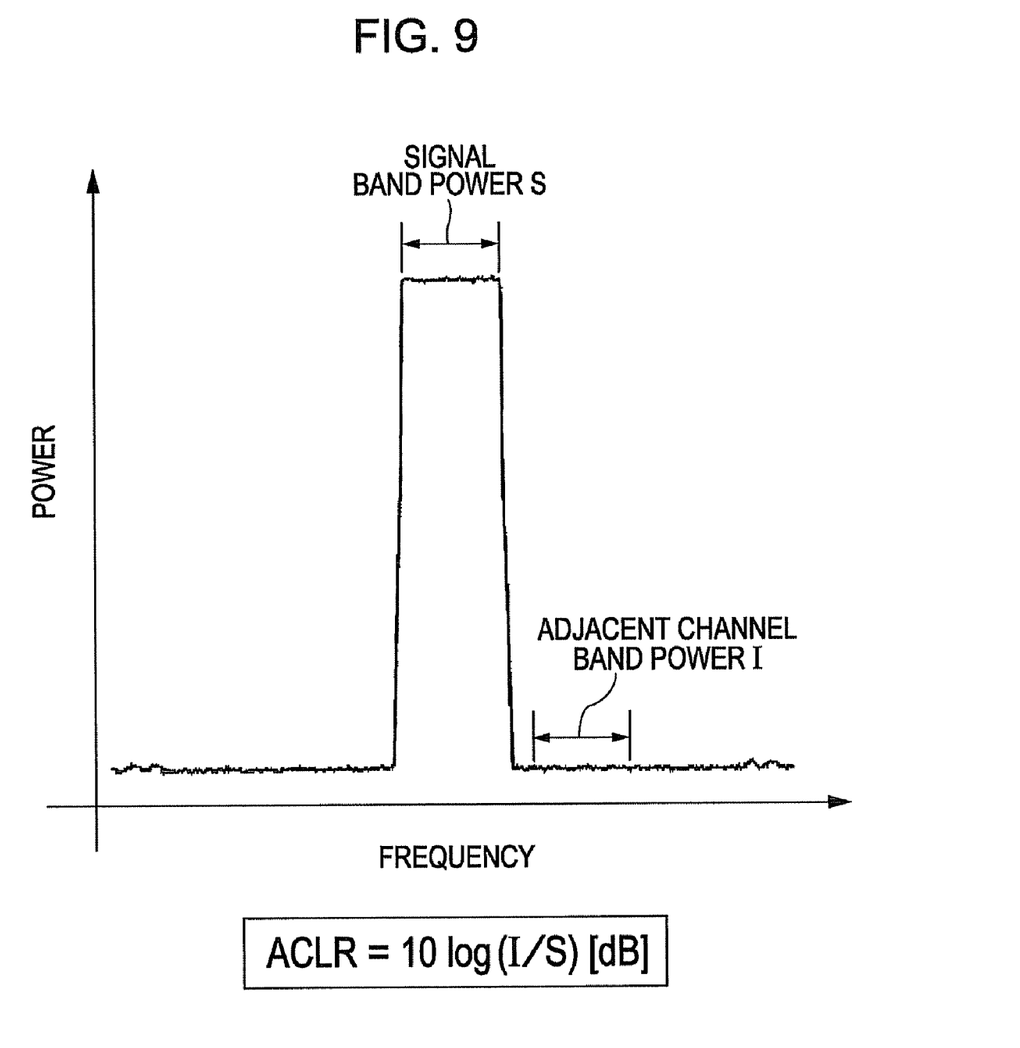
FIG. 9 is an illustration diagram of ACLR.

ACLR is a physical quantity illustrated in FIG. 9, and is defined as a ratio [dB] between an adjacent channel band power I and a signal band power S on a frequency spectrum, and is an index for indicating leakage of power to the adjacent channel.

In this manner, in the distortion compensation device of the present embodiment, by activating the power threshold value determination processing at the timing when the average value of the power value of the error signal exceeds the threshold value, or the timing when ACLR exceeds the threshold value, the processing can be effectively executed to determine the optima power threshold value and the number thereof and to restrain non linear distortion property with high accuracy.

The embodiment as described above is illustrated on the basis of a power series model. However, the disclosed technique can be applied to various series models.

All examples and conditional language recited herein are intended for pedagogical purposes to aid the reader in understanding the invention and the concepts contributed by the inventor to furthering the art, and are to be construed as being without limitation to such specifically recited examples and condition, nor does the organization of such examples in the specification relate to a showing of superiority and inferiority of the invention. Although the embodiment of the present inventions have been described in detail, it should be understood that the various changes, substitutions, and alternations could be made hereto without departing from the spirit and scope of the invention.

What is claimed is:

1. A predistortion apparatus for compensating for a distortion arising from a non linear property in input to output characteristics of an amplifier, by processing calculation of a plurality of coefficients for a plurality of power series defining the predistortion characteristics for a plurality of power ranges, respectively, so as to apply a reverse property corresponding to the non linear property in the amplifier to input of the amplifier, the predistortion apparatus comprising:

a coefficient update unit for setting and updating coefficients of the power series to provide the predistortion characteristics for the plurality of power ranges in accordance with a comparison between the input and output of the amplifier; and a determination unit for determining at least one threshold value defining the plurality of power ranges by shifting the threshold value and operating the coefficient update unit for updating the coefficients for each of the power series corresponding to each of the power ranges defined by the shifted threshold value so as to optimize the predistortion characteristics for each of the power ranges.

2. The predistortion apparatus according to claim 1, wherein the determination unit determines that the number of the threshold values, with changing the number of the threshold values, by comparing change degrees of differences of the determined threshold value obtained by each of the number of the threshold value.

3. The predistortion apparatus according to claim 1, wherein the determination unit sets coefficients of the power series corresponding to the determined threshold value as initial values to process calculation of the plurality of coefficients for the plurality of power series defining the predistortion characteristics for the plurality of power ranges.

4. The predistortion apparatus according to claim 1, further comprising:

a timing detection unit for calculating an average of a power value defined the comparison between the input and output of the amplifier, and activating the threshold value determination processing in the determination unit when the average of the power value exceeds a predetermined value.

5. The predistortion apparatus according to claim 1, further comprising:

a timing detection unit for calculating a ratio between an adjacent channel band power and a signal band power on the transmission signal outputted from the amplifier, and activating the threshold value determination processing in the determination unit when the ratio exceeds a predetermined value.

6. A predistortion method for compensating for a distortion arising from a non linear property in input to output characteristics of an amplifier, by processing calculation of a plurality of coefficients for a plurality of power series defining the predistortion characteristics for a plurality of power ranges, respectively, so as to apply a reverse property corresponding to the non linear property in the amplifier to input of the amplifier, the predistortion method comprising:

setting and updating coefficients of the power series to provide the predistortion characteristics for the plurality of power ranges in accordance with a comparison between the input and output of the amplifier; and determining at least one threshold value defining the plurality of power ranges by shifting the threshold value and updating the coefficients for each of the power series corresponding to each of the power ranges defined by the shifted threshold value so as to optimize the predistortion characteristics for each of the power ranges.

* * * * *